(12) United States Patent
Jimarez

(10) Patent No.: US 6,583,517 B1
(45) Date of Patent: Jun. 24, 2003

(54) METHOD AND STRUCTURE FOR JOINING TWO SUBSTRATES WITH A LOW MELT SOLDER JOINT

(75) Inventor: Miguel A. Jimarez, Newark Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/119,491

(22) Filed: Apr. 9, 2002

(51) Int. Cl.⁷ .......................... H01L 23/48; H01L 23/52; H01L 29/40
(52) U.S. Cl. .................. 257/781; 257/780; 257/779; 438/613
(58) Field of Search ................. 257/780, 781, 257/779, 778; 438/613, 614

(56) References Cited

U.S. PATENT DOCUMENTS

| | | | |
|---|---|---|---|
| 5,736,790 A | * | 4/1998 | Iyogi et al. |
| 5,874,780 A | | 2/1999 | Murakami |
| 5,929,521 A | * | 7/1999 | Wark et al. |
| 5,977,632 A | * | 11/1999 | Beddingfield |
| 6,002,172 A | * | 12/1999 | Desai et al. |
| 6,137,184 A | * | 10/2000 | Ikegami |
| 6,143,639 A | * | 11/2000 | Medlen |
| 6,162,997 A | | 12/2000 | Memis |
| 6,163,957 A | | 12/2000 | Jiang et al. |
| 6,320,254 B1 | * | 11/2001 | Liou et al. |
| 6,396,156 B1 | * | 5/2002 | Tang et al. |
| 6,399,896 B1 | * | 6/2002 | Downes, Jr. et al. |
| 6,433,426 B1 | * | 8/2002 | Ikegami et al. |

* cited by examiner

*Primary Examiner*—Sheila V. Clark
(74) *Attorney, Agent, or Firm*—Schmeiser, Olsen & Watts; Lawrence R. Fraley

(57) ABSTRACT

A method and structure to electrically and mechanically join a first a first electrically conductive pad on a first substrate to a second electrically conductive pad on a second substrate using a solder joint that includes a low-melt solder alloy composition. The second electrically conductive pad has a geometry that compels a gap size of a gap between the first substrate and the second substrate to exceed a distance between the first substrate and a surface of the second pad.

19 Claims, 4 Drawing Sheets

METHOD AND STRUCTURE FOR JOINING TWO SUBSTRATES WITH A LOW MELT SOLDER JOINT

BACKGROUND OF THE INVENTION

1. Technical Field

The present invention relates to an electronic structure and associated method joining two substrates with a low melt solder.

2. Related Art

Joining a chip to a chip carrier by completely melting a solder ball to form a solder joint between the chip and chip carrier may leave a gap between the chip and the chip carrier, such that the gap is too small to effectively fill with underfill. The underfill would encapsulate the solder joint to protect the solder joint from stresses induced during thermal cycling, wherein the thermal stresses result from a mismatch of coefficient of thermal expansion (CTE) between the chip and the chip carrier.

Thus, there is a need for an economical method and structure that enables underfill to effectively fill a gap between a chip and a chip carrier after the chip and the chip carrier are joined by completely melting a solder ball to form a solder joint between the chip and chip carrier.

SUMMARY OF THE INVENTION

The present invention provides an electrical structure, comprising:
  a first substrate, having a first electrically conductive pad thereon;
  a second substrate, having a second electrically conductive pad thereon; and
  a solder joint that mechanically and electrically joins the first pad to the second pad, wherein the solder joint includes a low-melt alloy composition, and wherein the second pad has a geometry that compels a gap size of a gap between the first substrate and the second substrate to exceed a distance between the first substrate and a surface of the second pad.

The present invention provides an electrical structure, comprising:
  a first substrate, having a first electrically conductive pad thereon;
  a second substrate, having a second electrically conductive pad thereon; and
  a solder joint that mechanically and electrically joins the first pad to the second pad, wherein the solder joint includes a low-melt alloy composition, and wherein the second pad has a geometry that compels a gap between the first substrate and the second substrate to have a gap size of at least about 2 mils.

The present invention provides a method for forming an electrical structure, comprising:
  providing a first substrate, having a first electrically conductive pad thereon;
  providing a second substrate, having a second electrically conductive pad thereon; and
  forming a solder joint that mechanically and electrically joins the first pad to the second pad, wherein the solder joint includes a low-melt alloy composition, and wherein the second pad has a geometry that compels a gap size of a gap between the first substrate and the second substrate to exceed a distance between the first substrate and a surface of the second pad.

DETAILED DESCRIPTION OF THE INVENTION

Figure 1:
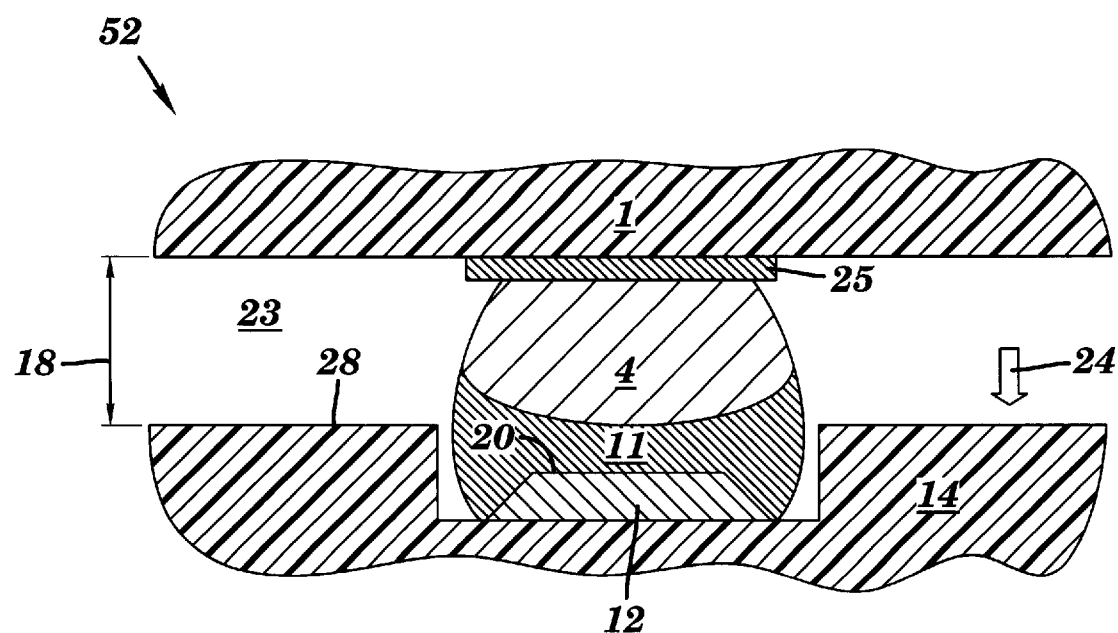
FIG. 1 illustrates a cross-sectional view of an electronic structure having a first substrate electrically coupled to an electrically conductive pad on a second substrate using a combination of a high melt solder and a low melt solder.

FIG. 1 illustrates a cross-sectional view of an electronic structure 52 having a first substrate electrically and mechanically coupled to a second substrate 14 using a controlled collapse chip connection (C4)solder ball 4 The electronic structure 52 may include, inter alia, a high performance ball grid array (HyperBGA®) module. The first substrate 1 and the second substrate 14 may include respectively, inter alia, a semiconductor device and a chip carrier, a semiconductor device and a circuit card, chip carrier and a circuit card, etc. The semiconductor device may include, inter alia, a semiconductor chip. The C4 solder ball 4 comprises a high melt solder (i.e., the liquidus temperature is greater than about 330° C.). The C4 solder ball 4 is attached to a first electrically conductive pad 25 on the first substrate 1. A low melt solder paste 11 (i.e., the liquidus temperature is about less than or equal to 260° Celsius is applied to a second electrically conductive pad 12 on the second substrate. The C4 solder ball 4 is placed on the low melt solder paste 11. The low melt solder paste 11 is heated to a reflow temperature (i.e., liquidus temperature) and then is allowed to cool, electrically and mechanically coupling the first substrate 1 to the second substrate 14. The C4 solder ball 4 does not melt at the reflow temperature of the low melt solder paste 8 and therefo between the first substrate 1 and the second substrate 14 Underfill is placed in the gap 23 between the first substrate 1 and the second substrate 14 to compensate for the coefficient of thermal expansion (CTE) mismatch between the first substrate 1 and the second substrate 14. A proper gap size 18 (after reflow) of the gap is critical to ensure a complete and uniform underfill placement around the solder connections thus reducing reliability issues. The standoff created by the C4 solder ball 4 allows for the use of the second electrically conductive pad 12, whereby a surface 20 of the second electrically conductive pad 12 is at a level that is lower (i.e., in the direction 24) than a level of a surface 28 of the second substrate 14, while maintaining an adequate gap size 18 of about 2 mils to 4.3 mils. The substrate 14 may include, inter alia, an organic or ceramic material. The C4 solder ball 4 may include, inter alia, a composition of 3% Tin and 97% lead. The low melt solder paste 8 may include, inter alia, a eutectic composition of 63% Tin and 37% lead.

Figure 2:
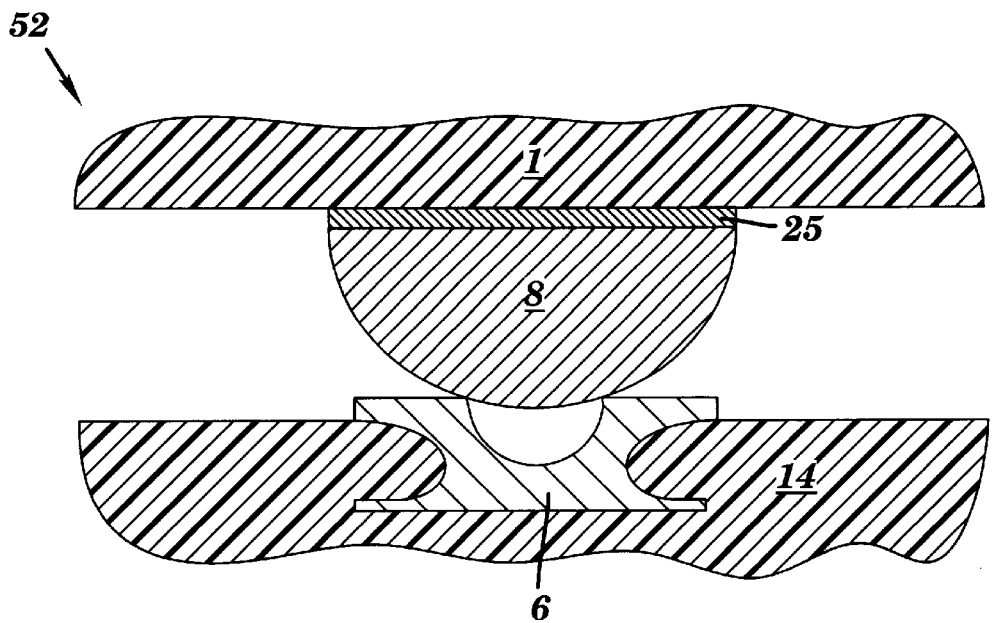
FIG. 2 illustrates a cross-sectional view of an electronic structure having a fully collapsible solder ball attached to a first conductive pad on a first substrate and placed on a second conductive pad on a second substrate, in accordance with embodiments of the present invention.

FIG. 2 illustrates a cross-sectional view of an electronic structure 52 having a fully collapsible solder ball 8 attached to a first substrate 1 and placed on a second substrate 14 in accordance with embodiments of the present invention. The electronic structure 52 may include, inter alia, a high performance ball grid array (HyperBGA®) module. The first substrate 1 and the second substrate 14 may include respectively, inter alia, a semiconductor device and a chip carrier, a semiconductor device and a circuit card, a chip carrier and a circuit card, etc. The semiconductor device may include, inter alia, a semiconductor chip. The fully collapsible solder ball 8 comprises a low-melt solder alloy composition. A low-melt solder alloy composition is defined herein; including in the claims, as a solder alloy composition having a liquidus temperature that is less than or equal to about 260° C. Other solder alloy compositions may be used such as solder alloy compositions that have a liquidus temperature that is less than or equal to about 250° C. or 240° C. The fully collapsible solder ball 8 is attached to a first electrically conductive pad 25 on the first substrate 1, and the fully collapsible solder ball 8 is placed on a second electrically conductive pad 6 on the second substrate 14. The fully collapsible solder ball 8 is heated to a reflow temperature at which the fully collapsible solder ball completely melts and then is allowed to cool, forming a solder joint 22 that electrically and mechanically couples the substrate 1 to the substrate 14 as shown in FIG. 3.

Figure 3:
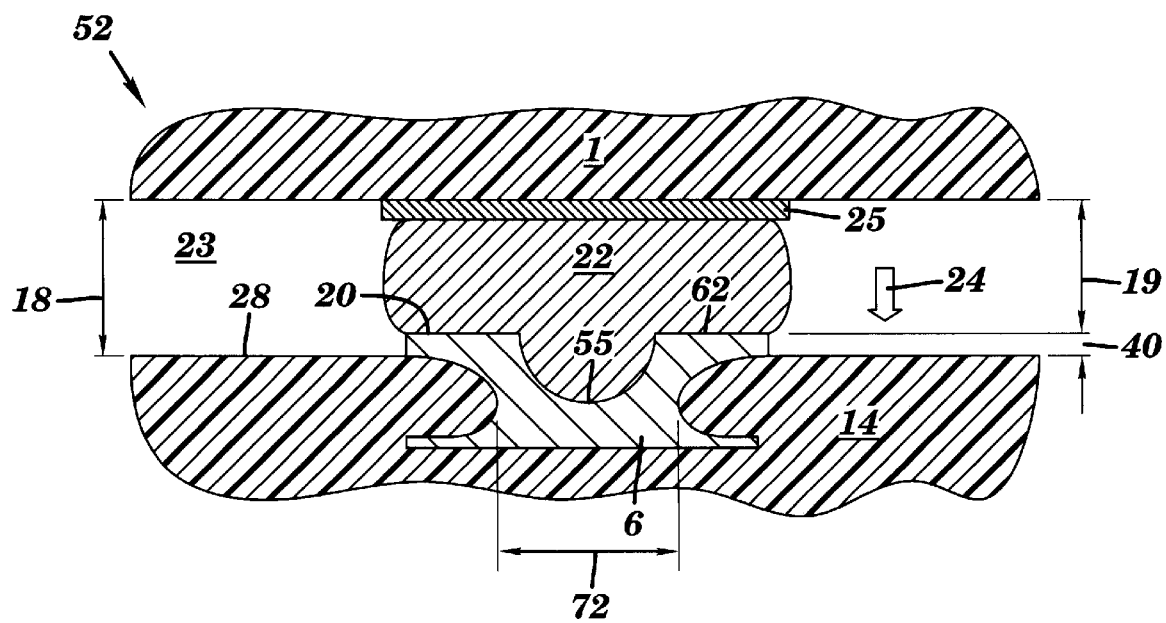
FIG. 3 illustrates FIG. 2 of the electronic structure after a solder joint is formed, electrically and mechanically coupling the first conductive pad on the first substrate to the second conductive pad on the second substrate, in accordance with embodiments of the present invention.

FIG. 3 illustrates FIG. 2 of the electronic structure 52 after the solder joint 22 is formed, electrically and mechanically coupling the first substrate 1 to the second substrate 14. A surface of the second electrically conductive pad 6 may have a diameter that is greater than a diameter 72. The second electrically conductive pad 6 may have a geometry that compels a gap size 18 of a gap 23, between the first substrate 1 and the second substrate 14, to exceed a distance 19 between the first substrate 1 and the surface 20 of the second electrically conductive pad 6. The second electrically conductive pad 6 may extend into the gap by an extension 40 such that the gap size 18 is about equal to the sum of the extension 40, the height (i.e., in the direction parallel to direction 24) of the solder joint 22 and the height (i.e., in the direction parallel to direction 24) of the first electrically conductive pad 25. The extension 40 may be in a range of about 0.7 mils to 1.2 mils. A first portion 55 of the second electrically conductive pad 6 may be at a level that is lower (i.e., in the direction 24 relative to the surface 28 of the second substrate 14 ) than a level of a second portion 62 of the second electrically conductive pad 6. The first portion 55 may be semi-spherical in shape. The second electrically conductive pad 6 is extended to allow for the use of the fully collapsible solder ball 8 (shown in FIG. 2) while maintaining an adequate gap size 18 of about at least 2 mils between the first substrate 1 and the second substrate 14 for underfill placement. Underfill is used in the gap between the first substrate 1 and the second substrate 14 to compensate for the coefficient of thermal expansion (CTE) mismatch between the first substrate 1 and the second substrate 14 An adequate gap size 18 is critical to ensure a complete and uniform underfill placement around the solder connections thus reducing reliability issues. The first substrate 1 and second substrate 14 may include, inter alia, an organic or ceramic material. The low melt solder 8 may include, inter alia, the compositions and melting points shown in Table 1. Note that other Sn/Pb alloy compositions may be used such that the liqidus temperature does not exceed about 260° C.

TABLE 1

Solder Compositions

| Alloy | Composition (wt %) | Liquidus Temperature in Degrees Celsius |
|---|---|---|
| Eutectic Sn/Pb | 63Sn/37Pb | 183 |
| Sn/Ag/Pb | 62Sn/Ag2/Pb36 | 189 |
| In/Sn | In50/Sn50 | 125 |
| Sn/Ag/Cu | Sn95.75/Ag3.5/Cu0.75 | 221–227 |
| Sn/Cu | Sn99.3/Cu0.7 | 227 |
| Sn/Bi | Sn99.85/Bi0.15 | 232 |
| Sn/Ag | Sn97.5/Ag2.5 | 226 |

Figure 4:
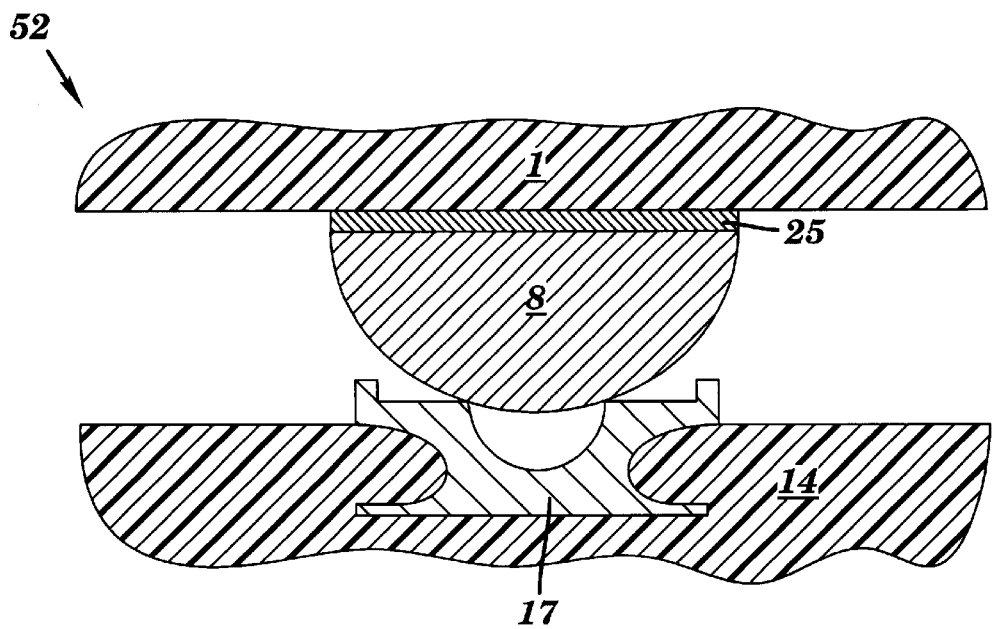
FIG. 4 illustrates FIG. 2 using an alternate second conductive pad, in accordance with embodiments of the present invention.

FIG. 4 illustrates a cross-sectional view of an electronic structure 52 having a fully collapsible solder ball 8 attached to a first substrate 1 and placed on a second substrate 14 in accordance with embodiments of the present invention. The electronic structure 52 may include, inter alia, a high performance ball grid array (HyperBGA®) module. The first substrate 1 and the second substrate 14 may include respectively, inter alia, a semiconductor device and a chip carrier, a semiconductor device and a circuit card, a chip carrier and a circuit card, etc. The semiconductor device may include, inter alia, a semiconductor chip. The fully collapsible solder ball 8 comprises a low-melt solder alloy composition. A low-melt solder alloy composition is defined herein; including in the claims, as a solder alloy composition having a liquidus temperature that is less than or equal to about 260° C. Other solder alloy compositions may be used such as solder alloy compositions that have a liquidus temperature that is less than or equal to about 250° C. or 240° C. The fully collapsible solder ball 8 is attached to a first electrically conductive pad 25 on the first substrate 1, and the fully collapsible solder ball 8 is placed on a second electrically conductive pad 17 on the second substrate 14 The fully collapsible solder ball 8 is heated to a reflow temperature at which the fully collapsible solder ball completely melts and then is allowed to cool, forming a solder joint 22 that electrically and mechanically couples the substrate 1 to the substrate 14 as shown in FIG. 5.

Figure 5:
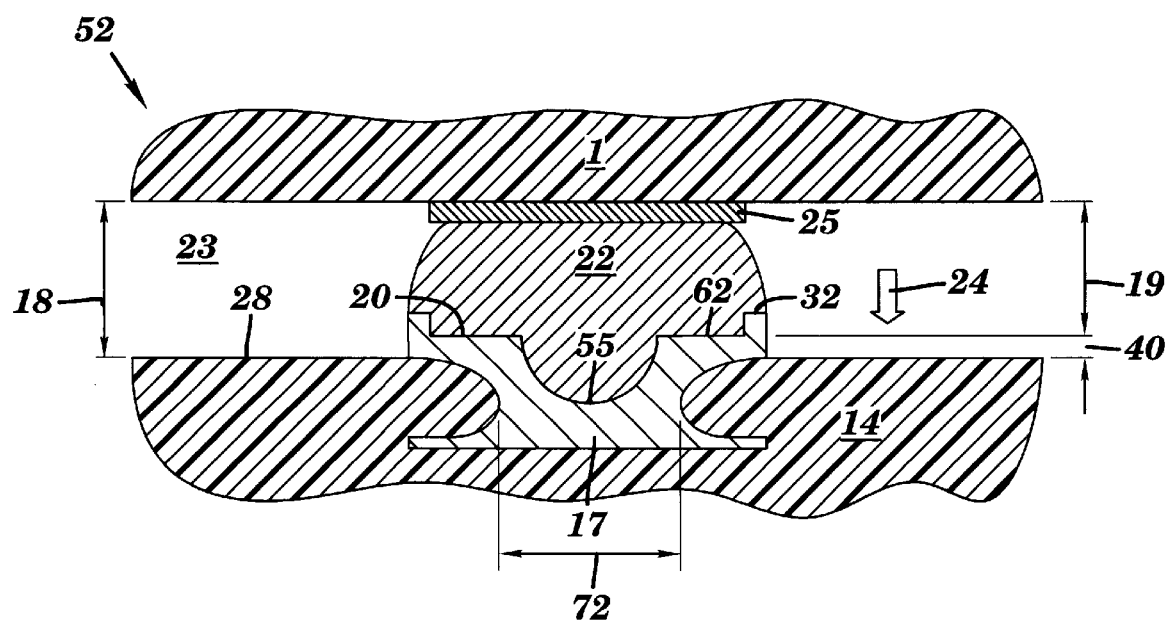
FIG. 5 illustrates FIG. 3 using an alternate second conductive pad, in accordance with embodiments of the present invention.

FIG. 5 illustrates FIG. 4 of the electronic structure 52 after the solder joint 22 is formed, electrically and mechanically coupling the first substrate 1 to the second substrate 14. A surface of the second electrically conductive pad 17 may have a diameter that is greater than a diameter 72 The second electrically conductive pad 17 may have a geometry that compels a gap size 18 of a gap 23 between the first substrate 1 and the second substrate 14, to exceed a distance between the first substrate 1 and the surface 20 of the second electrically conductive pad 17

The second electrically conductive pad 17 may extend into the gap by an extension 40 such that the gap size 18 is about equal to the sum of the extension 40, the height (i.e., in the direction parallel to direction 24) of the solder joint 22 and the height (i.e., in the direction parallel to direction 24) of the first electrically conductive pad 25. The extension 40 may be in a range of about 0.7 mils to 1.2 mils. A first portion 55 of the second electrically conductive pad 17 may be at a level that is lower (i.e., in the direction 24 relative to the surface 28 of the second substrate 14) than a level of a second portion 62 of the second electrically conductive pad 17 The first portion 55 may be semi-spherical in shape. A third portion of the 32 of the second electrically conductive pad 17 may be at a level that is higher (i.e., opposite the direction 24 relative to the surface 28 of the second substrate 14 ) than a level of a second portion 62 of the second electrically conductive pad 17 The second electrically conductive pad 17 is extended to allow for the use of the fully collapsible solder ball 8 (shown in FIG. 4) while maintaining an adequate gap size 18 of about at least 2 mils between the first substrate 1 and the second substrate 14 for underfill placement. Underfill is used in the gap between the first substrate 1 and the second substrate 14 to compensate for the coefficient of thermal expansion (CTE) mismatch between the first substrate 1 and the second substrate 14 An adequate gap size 18 is critical to ensure a complete and uniform underfill placement around the solder connections thus reducing reliability issues. The first substrate 1 and second substrate 14 may include, inter alia, an organic or ceramic material. The low melt solder 8 may include, inter alia, the compositions and melting points shown in Table 1. Note that other Sn/Pb alloy compositions may be used such that the liqidus temperature does not exceed about 260° C.

Figure 6:
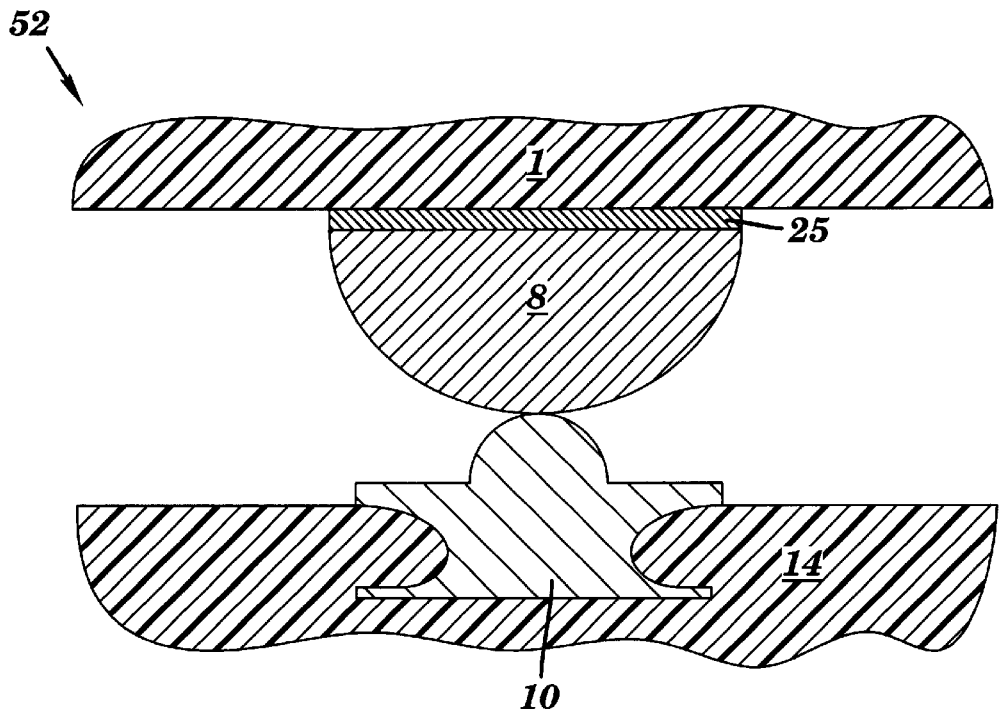
FIG. 6 illustrates FIG. 2 using another alternate second conductive pad, in accordance with embodiments of the present invention.

FIG. 6 illustrates a cross-sectional view of an electronic structure 52 having a fully collapsible solder ball 8 attached to a first substrate 1 and placed on a second substrate 14 in accordance with embodiments of the present invention. The electronic structure 52 may include, inter alia, a high performance ball grid array (HyperBGA®) module. The first substrate 1 and the second substrate 14 may include respectively, inter alia, a semiconductor device and a chip carrier, a semiconductor device and a circuit card, a chip carrier and a circuit card, etc. The semiconductor device may include, inter alia, a semiconductor chip. The fully collapsible solder ball 8 comprises a low-melt solder alloy composition. A low-melt solder alloy composition is defined herein; including in the claims, as a solder alloy composition having a liquidus temperature that is less than or equal to about 260° C. Other solder alloy compositions may be used such as solder alloy compositions that have a liquidus temperature that is less than or equal to about 250° C. or 240° C. The fully collapsible solder ball 8 is attached to a first electrically conductive pad 25 on the first substrate 1, and the fully collapsible solder ball 8 is placed on a second electrically conductive pad 10 on the second substrate 14. The fully collapsible solder ball 8 is heated to a reflow temperature at which the fully collapsible solder ball completely melts and then is allowed to cool, forming a solder joint 22 that electrically and mechanically couples the substrate 1 to the substrate 14 as shown in FIG. 7.

Figure 7:
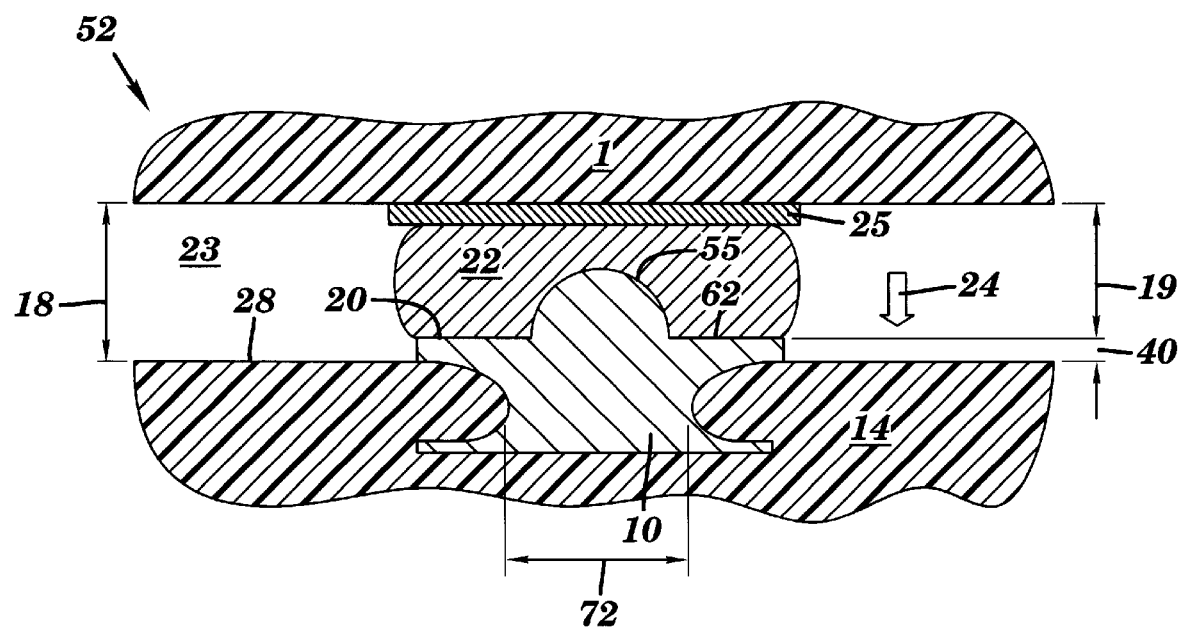
FIG. 7 illustrates FIG. 3 using another alternate second conductive pad, in accordance with embodiments of the present invention.

FIG. 7 illustrates FIG. 6 of the electronic structure 52 after the solder joint 22 is formed, electrically and mechanically coupling the first substrate 1 to the second substrate 14. A surface of the second electrically conductive pad 10 may have a diameter that is greater than a diameter 72 The second electrically conductive pad 10 may have a geometry that compels a gap size 18 of a gap 23 between the first substrate 1 and the second substrate 14, to exceed a distance 19 between the first substrate 1 and the surface 20 of the second electrically conductive pad 10. The second electrically conductive pad 6 may extend into the gap by an extension 40 such that the gap size 18 is about equal to the sum of the extension 40, the height (i.e., in the direction parallel to direction 24) of the solder joint 22 and the height (i.e., in the direction parallel to direction 24) of the first electrically conductive pad 25. The extension 40 may be in a range of about 0.7 mils to 1.2 mils. A first portion 55 of the second electrically conductive pad 10 may be at a level that is higher (i.e., opposite the direction 24 relative to the surface 28 of the second substrate 14 ) than a level of a second portion 62 of the second electrically conductive pad 10. The first portion 55 may be semi-spherical in shape. The second electrically conductive pad 10 is extended to allow for the use of the fully collapsible solder ball 8 (shown in FIG. 6) while maintaining an adequate gap size 18 of about at least 2 mils between the first substrate 1 and the second substrate 14 for underfill placement. Underfill is used in the gap between the first substrate 1 and the second substrate 14 to compensate for the coefficient of thermal expansion (CTE) mismatch between the first substrate 1 and the second substrate 14. An adequate gap size 18 is critical to ensure a complete and uniform underfill placement around the solder connections thus reducing reliability issues. The first substrate 1 and second substrate 14 may include, inter alia, an organic or ceramic material. The low melt solder 8 may include, inter alia, the compositions and melting points shown in Table 1. Note that other Sn/Pb alloy compositions may be used such that the liqidus temperature does not exceed about 260° C.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:
   a first substrate, having a first electrically conductive pad thereon;
   second substrate, having a second electrically conductive pad thereon; and
   a solder joint that mechanically and electrically joins the first pad to the second pad, wherein the solder joint includes a low-melt alloy composition, wherein the solder joint is in direct mechanical contact with the first electrically conductive pad, wherein the solder joint is in direct mechanical contact with the second electrically conductive pad, and wherein the second pad has a geometry such that a gap size of a gap between the first substrate and the second substrate exceeds a distance between the first substrate and a surface of the second pad.

2. An electrical structure, comprising:
   a first substrate, having a first electrically conductive pad thereon;
   a second substrate, having a second electrically conductive pad thereon; and
   a solder joint that mechanically and electrically joins the first pad to the second pad, wherein the solder joint includes a low-melt alloy composition, wherein the second pad has a geometry such that a gap size of a gap between the first substrate and the second substrate exceeds a distance between the first substrate and a surface of the second pad, and wherein a portion of the second pad extends into the gap by an extension such that the gap size is about equal to the sum of the extension, a height of the solder joint, and a height of the first pad.

3. The electrical structure of claim 2, wherein the extension is between about 0.7 mils and about 1.2 mils.

4. The electrical structure of claim 2, wherein the height of the solder joint does not exceed about 1.6 mils.

5. The electrical structure of claim 1, wherein the gap size is at least about 2 mils.

6. The electrical structure of claim 5, wherein an underfill within the gap encapsulates the solder joint.

7. The electrical structure of claim 1, wherein the alloy composition has a substantially lead-free composition.

8. The electrical structure of claim 1, wherein the alloy composition comprises a lead-tin alloy that completely melts at or above the lead-tin eutectic temperature.

9. The electrical structure of claim 1, wherein the first substrate comprises a semiconductor device, and wherein the second substrate comprises a chip carrier.

10. The electrical structure of claim 9, wherein the chip carrier is an organic chip carrier.

11. The electrical structure of claim 9, wherein the chip carrier is a ceramic chip carrier.

12. The electrical structure of claim 1, wherein the first substrate comprises a chip carrier, and wherein the second substrate comprises a circuit card.

13. A method for forming an electronic structure, comprising:

providing a first substrate, having a first electrically conductive pad thereon;

providing a second substrate, having a second electrically conductive pad thereon; and forming a solder joint that mechanically and electrically joins the first pad to the second pad, wherein the solder joint includes a low-melt alloy composition, wherein the solder joint is in direct mechanical contact with the first electrically conductive pad, wherein the solder joint is in direct mechanical contact with the second electrically conductive pad, and wherein the second pad has a geometry such that a gap size of a gap between the first substrate and the second substrate exceeds a distance between the first substrate and a surface of the second pad.

14. The method of claim 13, wherein said forming comprises completely melting a solder ball such that said solder ball upon being cooled becomes said solder joint.

15. The method of claim 13, wherein a portion of the second pad extends into the gap by an extension such that the gap size is about equal to the sum of the extension, a height of the solder joint, and a height of the first pad.

16. The method of claim 13, wherein the extension is between about 0.7 mils and about 1.2 mils.

17. The method of claim 13, wherein the gap size is at least about 2 mils.

18. The method of claim 13, wherein the alloy composition has a substantially lead-free composition.

19. The method of claim 13, wherein the first substrate comprises a semiconductor device, and wherein the second substrate comprises a chip carrier.

* * * * *